US012763767B2

(12) United States Patent
Huang

(10) Patent No.: US 12,763,767 B2
(45) Date of Patent: Oct. 13, 2026

(54) SWITCHING CIRCUIT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 10 days.

(21) Appl. No.: 19/052,921

(22) Filed: Feb. 13, 2025

(65) Prior Publication Data

US 2025/0266828 A1 Aug. 21, 2025

(30) Foreign Application Priority Data

Feb. 16, 2024 (TW) ................................ 113105572

(51) Int. Cl.
*H03K 17/687* (2006.01)
*H03H 19/00* (2006.01)

(52) U.S. Cl.
CPC ....... *H03K 17/6871* (2013.01); *H03H 19/004* (2013.01)

(58) Field of Classification Search
CPC ......................... H03K 17/6871; H03H 19/004
USPC .......................................................... 327/427
See application file for complete search history.

(56) References Cited

U.S. PATENT DOCUMENTS 4,205,369 A * 5/1980 Asano ..................... H02M 3/07 363/62
6,483,282 B1 * 11/2002 Bayer ................... H02M 3/073 327/536
6,563,235 B1 * 5/2003 McIntyre ................ H02M 3/07 307/110
6,693,808 B2 * 2/2004 Myono ................... H02M 3/07 363/62
6,834,001 B2 * 12/2004 Myono ................... H02M 3/07 363/60
7,602,232 B2 * 10/2009 Georgescu ............. H02M 3/07 327/536
8,259,476 B2 * 9/2012 Ben-Yaakov ........... H02M 3/07 363/60

(Continued)

FOREIGN PATENT DOCUMENTS

CN 112583254 A 3/2021
CN 117118422 A 11/2023

(Continued)

OTHER PUBLICATIONS

OA letter of a counterpart TW application (appl. No. 113105572) mailed on Oct. 22, 2024.

(Continued)

*Primary Examiner* — Ryan Jager
(74) *Attorney, Agent, or Firm* — WPAT, PC

(57) ABSTRACT

A switching circuit receives an input voltage and outputs an output voltage, and includes a first switched-capacitor circuit, a second switched-capacitor circuit, and a switch. The first switched-capacitor circuit is configured to receive the input voltage to generate an intermediate voltage. The second switched-capacitor circuit is coupled to the first switched-capacitor circuit and is configured to receive the intermediate voltage to generate the output voltage. One terminal of the switch receives the input voltage, and another terminal of the switch is coupled to the second switched-capacitor circuit.

15 Claims, 15 Drawing Sheets

200

(56) References Cited

U.S. PATENT DOCUMENTS

| | | | | |
|---|---|---|---|---|
| 8,295,064 | B2 * | 10/2012 | Shiwaya | H02M 3/07 363/60 |
| 9,246,382 | B2 * | 1/2016 | Pan | H02M 3/07 |
| 9,647,536 | B2 * | 5/2017 | Reddy | G11C 5/14 |
| 9,973,080 | B2 * | 5/2018 | Teh | H02M 3/07 |
| 10,277,120 | B1 * | 4/2019 | Krstic | H02M 3/07 |
| 11,070,207 | B2 | 7/2021 | Huang | |
| 11,316,424 | B2 * | 4/2022 | Giuliano | H02M 3/07 |
| 11,581,884 | B1 | 2/2023 | Huang | |
| 12,107,495 | B2 * | 10/2024 | Giuliano | H02M 3/073 |
| 2021/0099085 | A1 * | 4/2021 | Lau | H02M 3/07 |
| 2021/0367511 | A1 * | 11/2021 | Liu | H02M 3/01 |
| 2022/0173736 | A1 | 6/2022 | Garg | |
| 2023/0091800 | A1 | 3/2023 | Huang | |

FOREIGN PATENT DOCUMENTS

| | | |
|---|---|---|
| TW | I703822 B | 9/2020 |
| TW | I774563 | 8/2022 |
| TW | I806169 | 6/2023 |

OTHER PUBLICATIONS

Huang, "Continuously operating bootstrapped switch", U.S. Appl. No. 19/011,685, filed Jan. 7, 2025, USPTO.

Huang, "Switch circuit", U.S. Appl. No. 19/032,473, filed Jan. 21, 2025, USPTO.

* cited by examiner

SWITCHING CIRCUIT

BACKGROUND OF THE INVENTION

1. Field of the Invention

The present invention generally relates to a switching circuit.

2. Description of Related Art

Reference is made to FIG. 1, which is a functional block diagram of a conventional switching circuit. A switching circuit 100 includes a switched-capacitor circuit 110 and a switched-capacitor circuit 120, which are connected in series. When the switched-capacitor circuit 110 is turned on, the intermediate voltage Vb is substantially equal to the input voltage Vin. When the switched-capacitor circuit 120 is turned on, the output voltage Vout is substantially equal to the intermediate voltage Vb. The advantage of the switching circuit 100 is that it can reduce crosstalk (e.g., when used as a part of a sampling T-switch), or reduce timing skew (e.g., when used as the sampling switch of a 2-rank time-interleaved analog-to-digital converter (TIADC)).

However, because the switched-capacitor circuit 110 and the switched-capacitor circuit 120 both include at least one capacitor and at least one switch, and the at least one capacitor and the at least one switch have unavoidable signal delays (e.g., the time from the switched-capacitor circuit 110 being turned on to the intermediate voltage Vb being substantially equal to the input voltage Vin), the overall turn-on speed of the switching circuit 100 is reduced.

SUMMARY OF THE INVENTION

In view of the issues of the prior art, an object of the present invention is to provide a switching circuit, so as to make an improvement to the prior art.

According to one aspect of the present invention, a switching circuit is provided. The switching circuit is configured to receive an input voltage and output an output voltage, and includes a first switched-capacitor circuit, a second switched-capacitor circuit, and a switch. The first switched-capacitor circuit is configured to receive the input voltage to generate an intermediate voltage. The second switched-capacitor circuit is coupled to the first switched-capacitor circuit and is configured to receive the intermediate voltage to generate the output voltage. One terminal of the switch receives the input voltage, and another terminal of the switch is coupled to the second switched-capacitor circuit.

The technical means embodied in the embodiments of the present invention can solve at least one of the problems of the prior art. Therefore, compared to the prior art, the present invention can improve the overall turn-on speed of a switching circuit.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a switching circuit. On account of that some or all elements of the switching circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following discussion, each transistor has a first terminal, a second terminal, and a control terminal. When the transistor is used as a switch, the first terminal and the second terminal of the transistor are the two terminals of the switch, and the control terminal controls the switch to be turned on (the transistor is turned on) or turned off (the transistor is turned off). For a Metal-Oxide-Semiconductor Field-Effect Transistor (MOSFET), the first terminal may be one of the source and the drain, the second terminal may be the other of the source and the drain, and the control terminal is the gate. For a bipolar junction transistor (BJT), the first terminal may be one of the collector and the emitter, the second terminal may be the other of the collector and the emitter, and the control terminal is the base.

Figure 1:
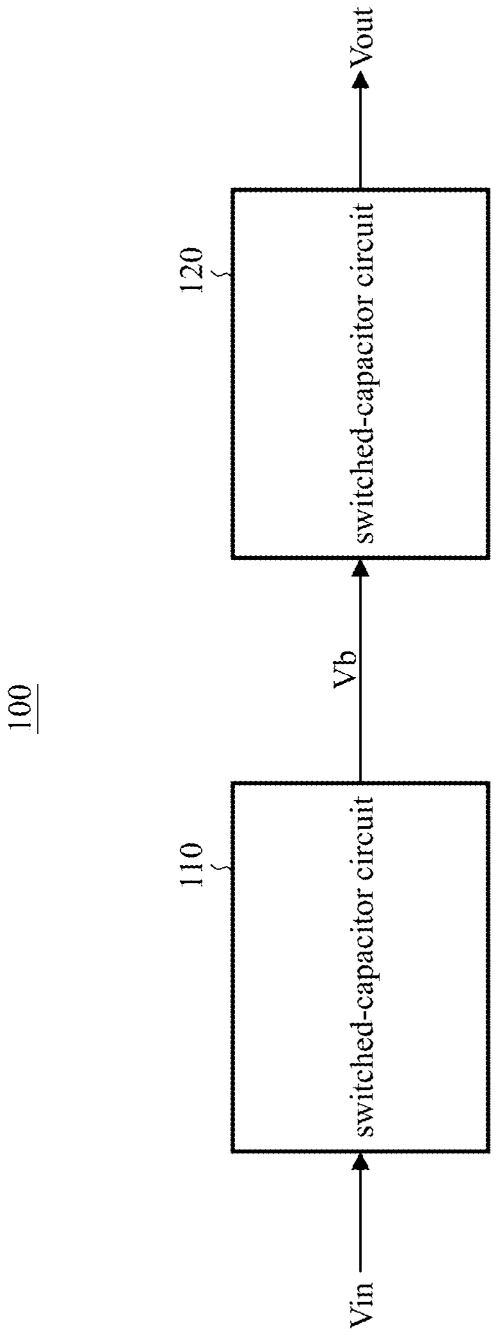
FIG. 1 (prior art)
FIG. 1 is the functional block diagram of a conventional switching circuit.
Figure 2:
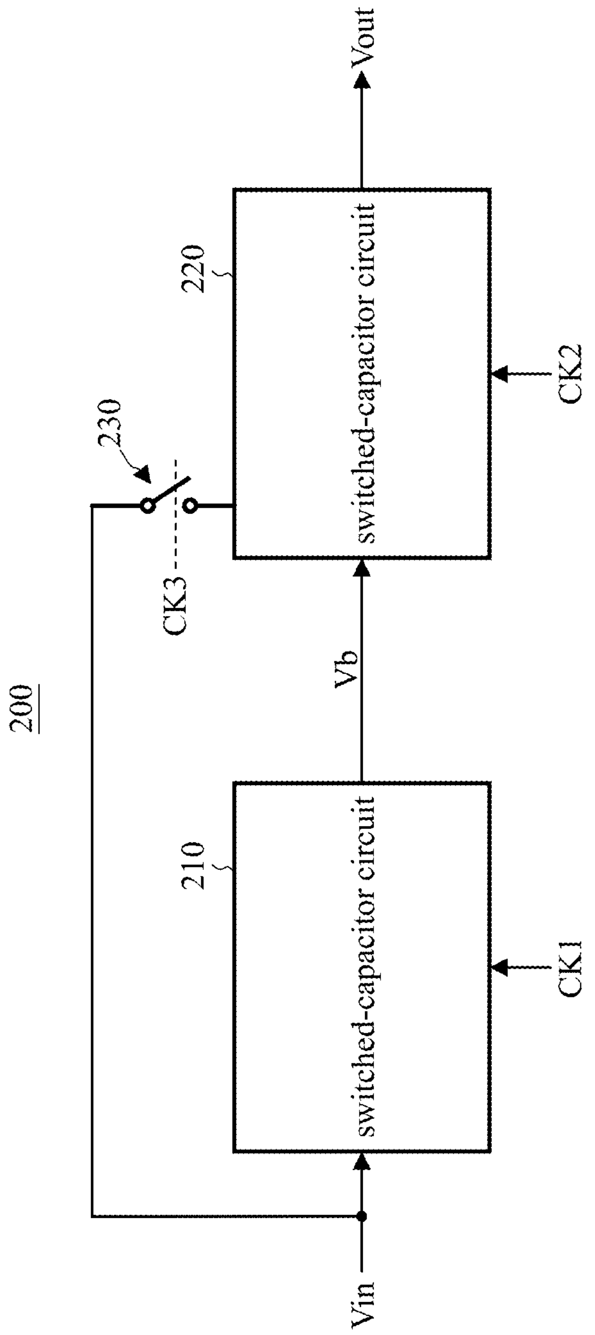
FIG. 2 is the functional block diagram of the switching circuit according to an embodiment of the present invention.

Reference is made to FIG. 2, which is a functional block diagram of the switching circuit according to an embodiment of the present invention. A switching circuit 200 includes a switched-capacitor circuit 210, a switched-capacitor circuit 220, and a switch 230. The switched-capacitor circuit 210, the switched-capacitor circuit 220, and the switch 230 are coupled to each other. When the switched-capacitor circuit 210 is turned on, the intermediate voltage Vb is substantially equal to the input voltage Vin. When the switched-capacitor circuit 220 is turned on, the output voltage Vout is substantially equal to the intermediate voltage Vb.

The switched-capacitor circuit 220 further receives the input voltage Vin through the switch 230. More specifically, one terminal of the switch 230 receives the input voltage Vin, while another terminal of the switch 230 is coupled or electrically connected to the switched-capacitor circuit 220.

The switched-capacitor circuit 210, the switched-capacitor circuit 220, and the switch 230 operate according to a clock CK1, a clock CK2, and a clock CK3, respectively.

Figure 3A:
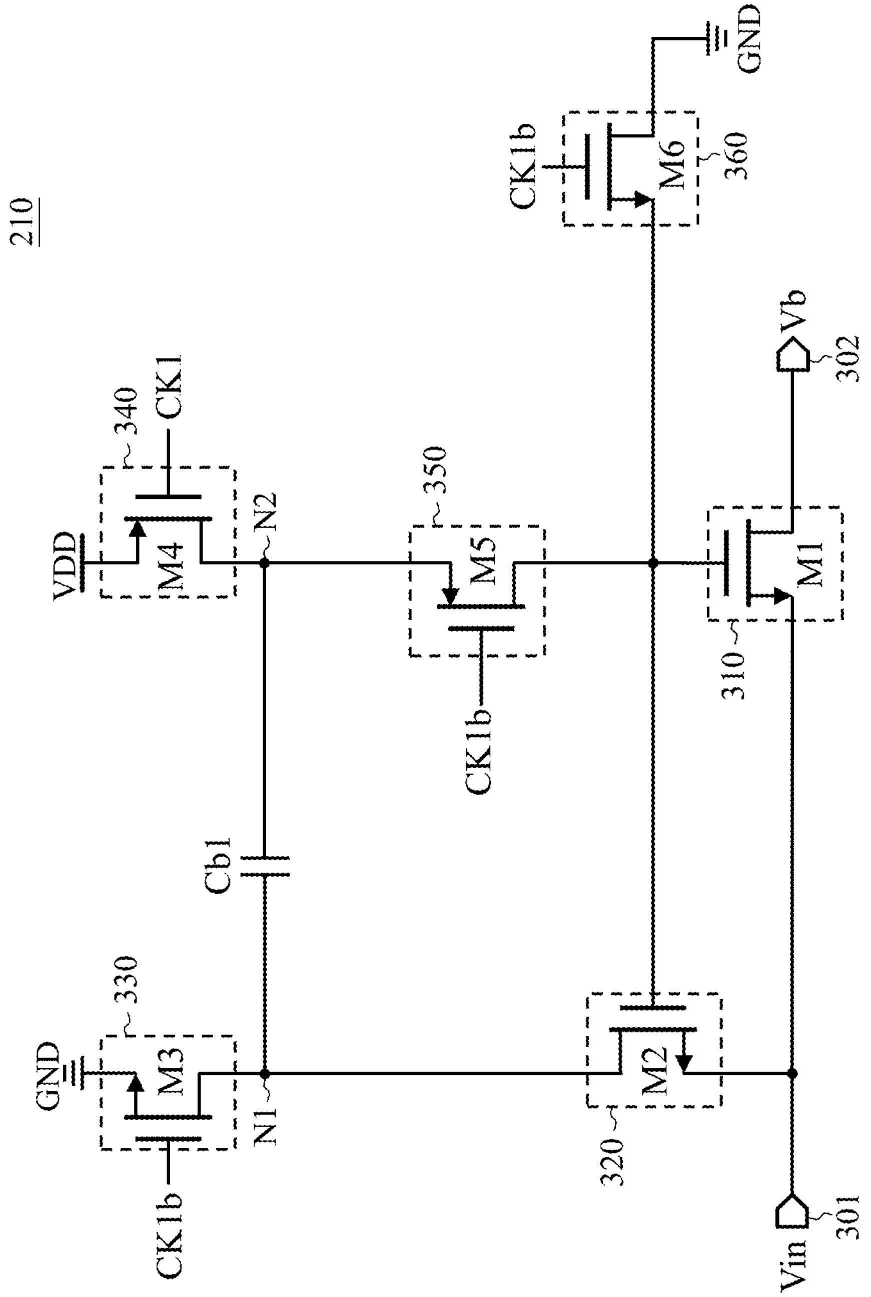
FIG. 3A is a circuit diagram of the switched-capacitor circuit 210 according to an embodiment of the present invention.

Reference is made to FIG. 3A, which is a circuit diagram of the switched-capacitor circuit 210 according to an embodiment of the present invention. The switched-capacitor circuit 210 may be a bootstrapped switch, containing a capacitor Cb1, a switch 310, a switch 320, a switch 330, a switch 340, a switch 350, and a switch 360. The capacitor Cb1 is the bootstrap capacitor of the bootstrapped switch, and the two terminals of the capacitor Cb1 are a node N1 and a node N2, respectively. The switched-capacitor circuit 210 receives the input voltage Vin through the input terminal 301 and outputs the intermediate voltage Vb through the output terminal 302.

The switch 310 is embodied by an N-channel Metal-Oxide-Semiconductor Field-Effect Transistor (hereinafter referred to as the NMOS transistor) M1. One terminal (source) of the switch 310 is coupled or electrically connected to the input terminal 301; another terminal (drain) of the switch 310 is coupled or electrically connected to the output terminal 302; the control terminal of the switch 310 is the gate of the NMOS transistor M1.

The switch 320 is embodied by an NMOS transistor M2. One terminal (source) of the switch 320 is coupled or electrically connected to the input terminal 301; another terminal (drain) of the switch 320 is coupled or electrically connected to the node N1; the control terminal (gate) of the switch 320 is coupled or electrically connected to the control terminal of the switch 310.

The switch 330 is embodied by an NMOS transistor M3. One terminal (source) of the switch 330 is coupled or electrically connected to the reference voltage GND (e.g., the ground level); another terminal (drain) of the switch 330 is coupled or electrically connected to the node N1; the control terminal (gate) of the switch 330 receives the clock CK1*b*.

The switch 340 is embodied by a P-channel Metal-Oxide-Semiconductor Field-Effect Transistor (hereinafter referred to as the PMOS transistor) M4. One terminal (source) of the switch 340 is coupled or electrically connected to the reference voltage VDD (e.g., the power supply voltage); another terminal (drain) of the switch 340 is coupled or electrically connected to the node N2; the control terminal (gate) of the switch 340 receives the clock CK1.

The switch 350 is embodied by the PMOS transistor M5. One terminal (source) of the switch 350 is coupled or electrically connected to the node N2; another terminal (drain) of the switch 350 is coupled or electrically connected to the control terminal of the switch 310; the control terminal (gate) of the switch 350 receives the clock CK1*b*.

The switch 360 is embodied by the NMOS transistor M6. One terminal (source) of the switch 360 is coupled or electrically connected to the control terminal of the switch 310; another terminal (drain) of the switch 360 is coupled or electrically connected to the reference voltage GND; the control terminal (gate) of the switch 360 receives the clock CK1*b*.

The switched-capacitor circuit 210 operates according to the clock CK1 and the clock CK1*b*. The clock CK1 and the clock CK1*b* are each other's inverted signals. More specifically, when the clock CK1*b* is at a first level (e.g., a high level), the switch 330, the switch 340, and the switch 360 are turned on, and the switch 310, the switch 320, and the switch 350 are turned off. When the clock CK1*b* is at a second level (e.g., a low level), the switch 330, the switch 340, and the switch 360 are turned off, and the switch 310, the switch 320, and the switch 350 are turned on.

Because the clock CK1 and the clock CK1*b* are each other's inverted signals, the switched-capacitor circuit 210 is equivalent to operating according to only one of them.

Figure 3B:
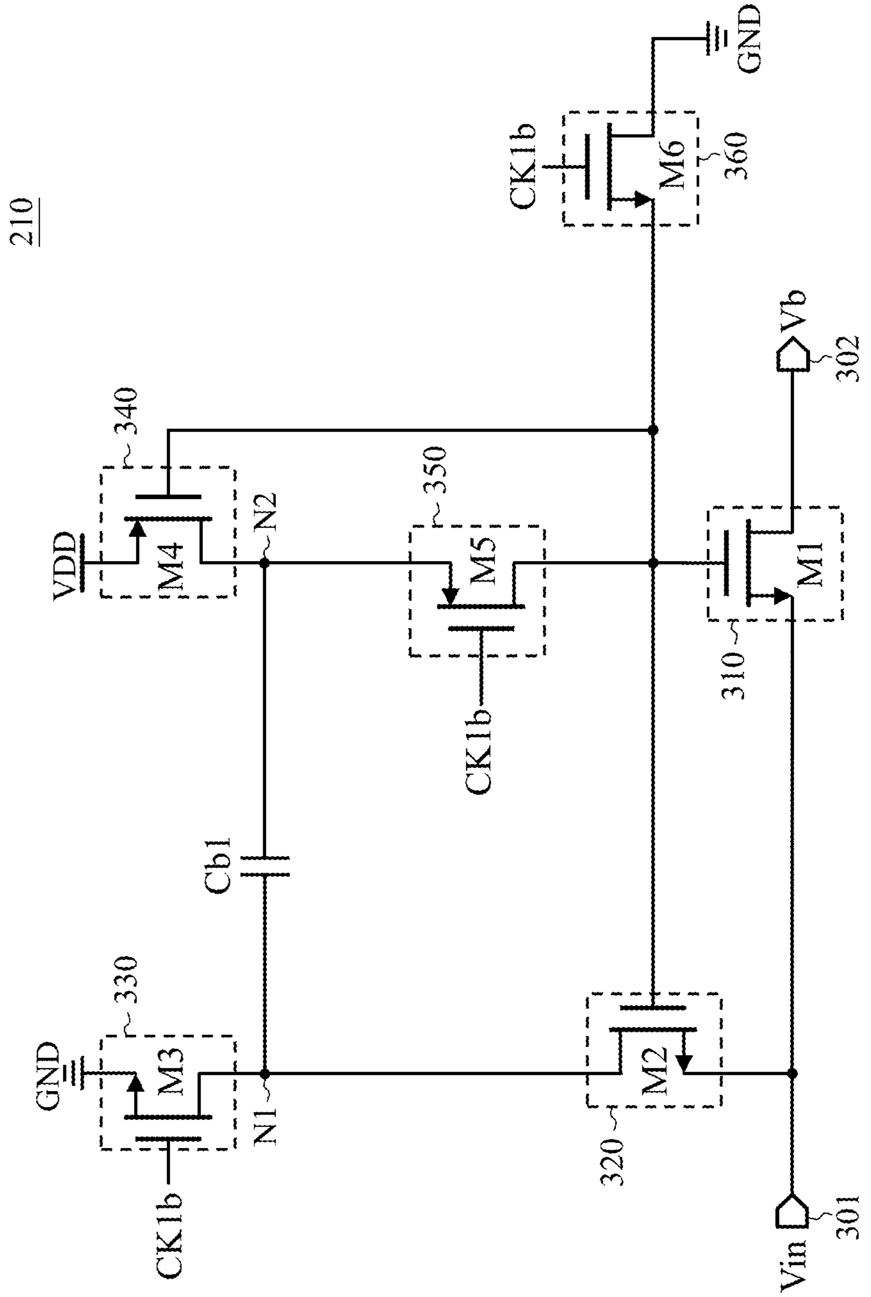
FIG. 3B is a circuit diagram of the switched-capacitor circuit 210 according to another embodiment of the present invention.

Reference is made to FIG. 3B, which is a circuit diagram of the switched-capacitor circuit 210 according to another embodiment of the present invention. FIG. 3B is similar to FIG. 3A, except that in the embodiment of FIG. 3B, the control terminal of the switch 340 is coupled or electrically connected to the control terminal of the switch 310, instead of receiving the clock CK1.

Figure 4A:
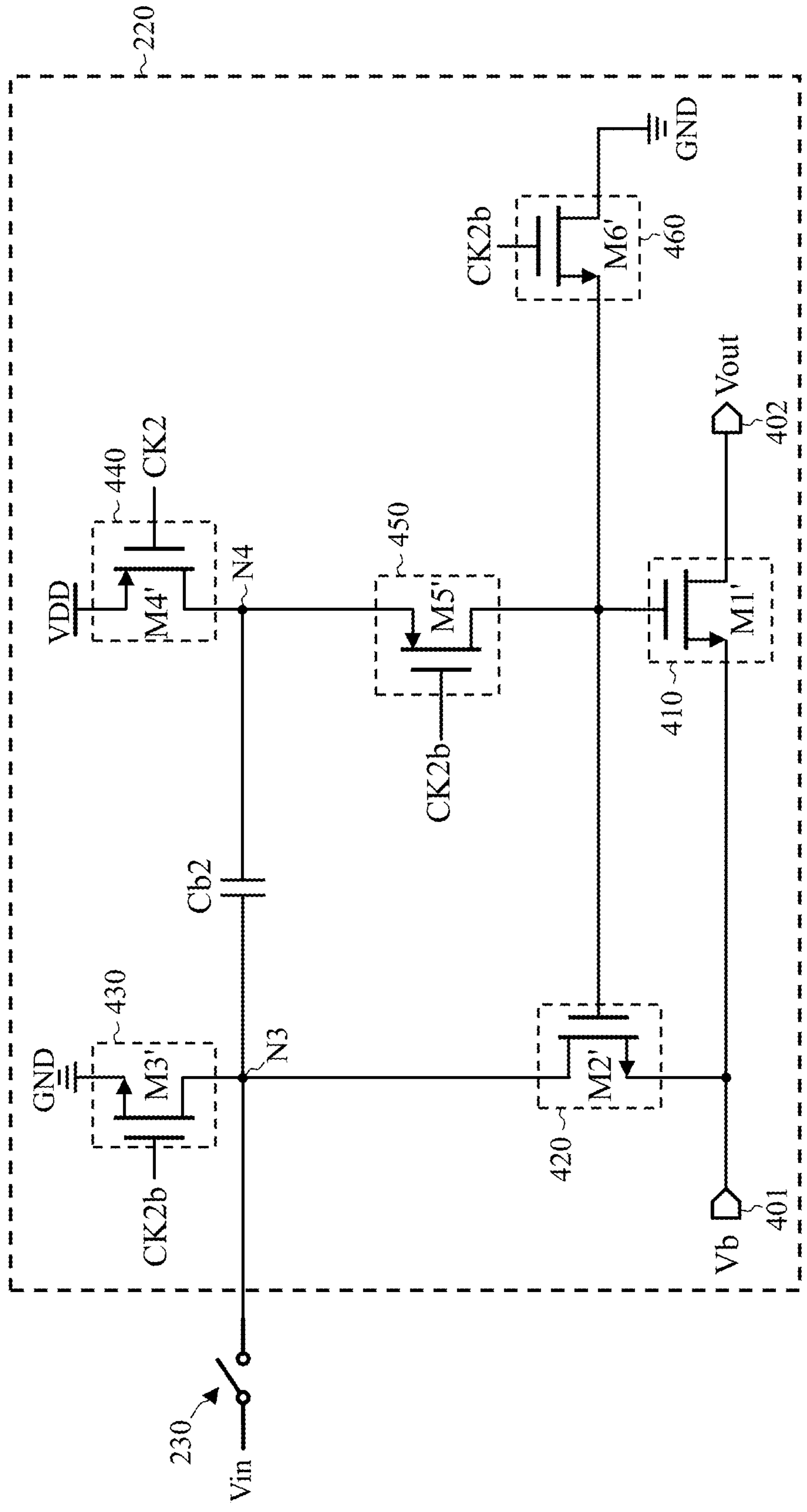
FIG. 4A is a circuit diagram of the switched-capacitor circuit 220 according to an embodiment of the present invention.

Reference is made to FIG. 4A, which is a circuit diagram of the switched-capacitor circuit 220 according to an embodiment of the present invention. The switched-capacitor circuit 220 includes a capacitor Cb2, a switch 410, a switch 420, a switch 430, a switch 440, a switch 450, and a switch 460. The two terminals of the capacitor Cb2 are a node N3 and a node N4, respectively. The switched-capacitor circuit 220 receives the intermediate voltage Vb through the input terminal 401 and outputs the output voltage Vout through the output terminal 402. The switch 230 is coupled or electrically connected to the node N3.

In the embodiment of FIG. 4A, the switched-capacitor circuit 220 is also a bootstrapped switch (where the capacitor Cb2 is the bootstrap capacitor of the bootstrapped switch). The switch 410 (M1'), the switch 420 (M2'), the switch 430 (M3'), the switch 440 (M4'), the switch 450 (M5'), and the switch 460 (M6') correspond respectively to the switch 310 (M1), the switch 320 (M2), the switch 330 (M3), the switch 340 (M4), the switch 350 (M5), and the switch 360 (M6) in FIG. 3A. People having ordinary skill in the art can understand the operating principle of the switched-capacitor circuit 220 based on the discussion of FIG. 3A.

The switched-capacitor circuit 220 operates according to the clock CK2 and the clock CK2*b*. Because the clock CK2 and the clock CK2*b* are each other's inverted signals, the switched-capacitor circuit 220 is equivalent to operating according to only one of them.

Figure 4B:
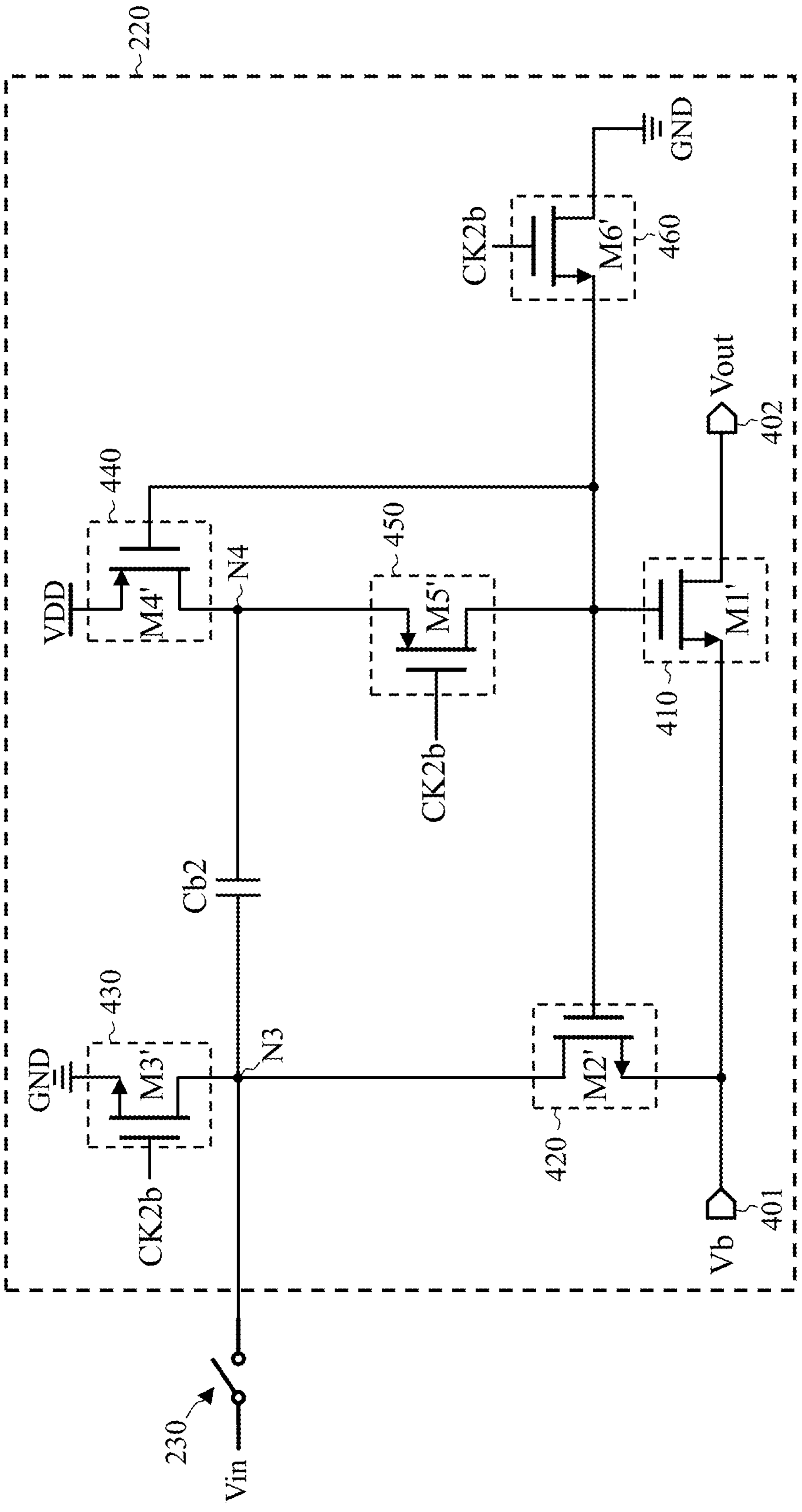
FIG. 4B is a circuit diagram of the switched-capacitor circuit 220 according to another embodiment of the present invention.

Reference is made to FIG. 4B, which is a circuit diagram of the switched-capacitor circuit 220 according to another embodiment of the present invention. FIG. 4B is similar to FIG. 4A, except that, in the embodiment of FIG. 4B, the control terminal of the switch 440 is coupled or electrically connected to the control terminal of the switch 410, instead of receiving the clock CK2.

Figure 5A:
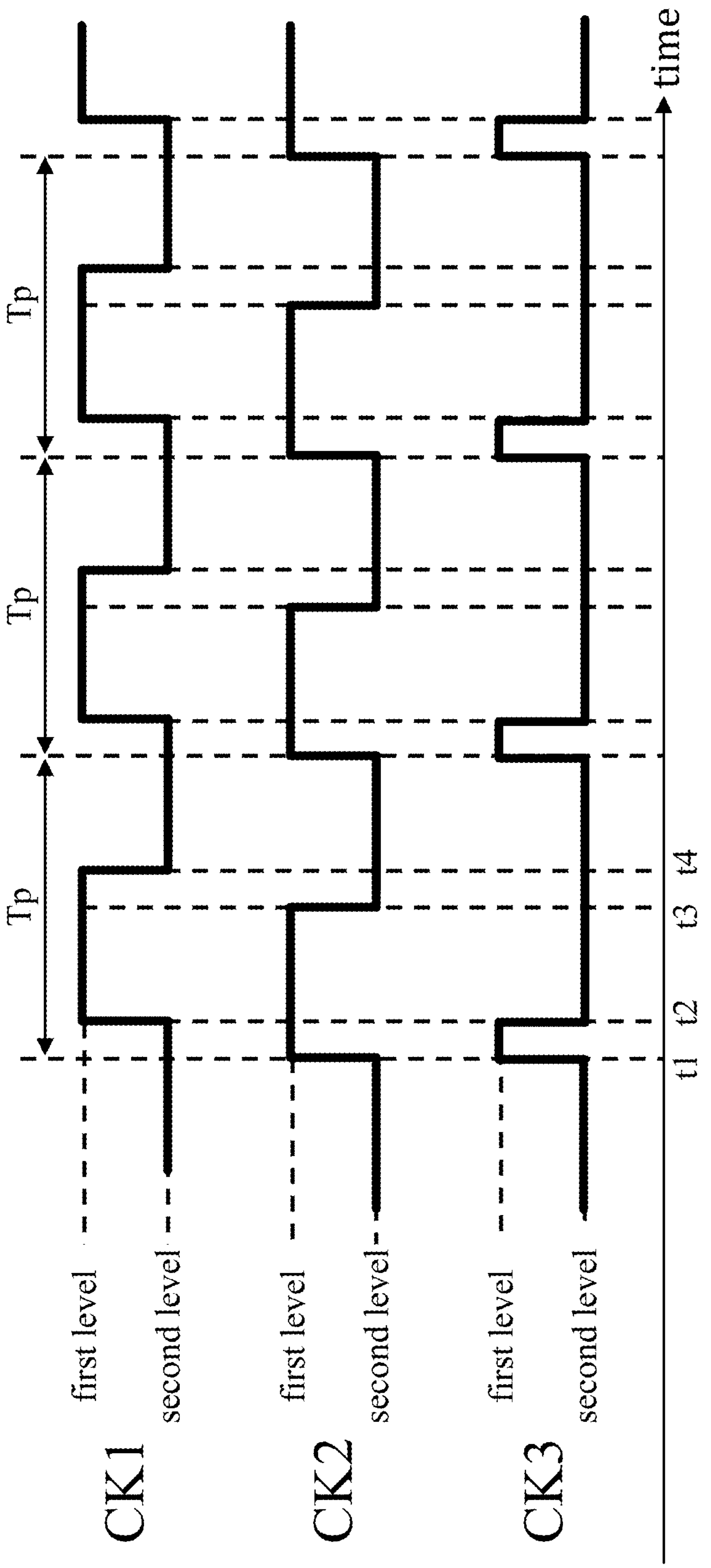
FIG. 5A shows waveforms of the operating clocks of the switching circuit according to an embodiment of the present invention.

Reference is made to FIG. 5A, which shows waveforms of the operating clocks of the switching circuit 200 according to an embodiment of the present invention. FIG. 5A corresponds to the switching circuit 200 applied to a T-switch (i.e., as a part of the T-switch). The clock CK1 and the clock CK2 are both periodic clocks. The clock CK3 may be a periodic pulsed signal.

During an operating cycle Tp of the switching circuit 200, the switched-capacitor circuit 220 is first turned on (corresponding to the clock CK2 transitioning from the second level to the first level, for example, at the time point t1), and then the switched-capacitor circuit 210 is turned on (corresponding to the clock CK1 transitioning from the second level to the first level, for example, at the time point t2). The switch 230 conducts for a period of time after the switched-capacitor circuit 220 is turned on (e.g., between the time point t1 and the time point t2); that is to say, the clock CK3 is at the first level during the period of time after the clock CK2 transitions from the second level to the first level.

During an operating cycle Tp of the switching circuit 200, the switched-capacitor circuit 220 is first turned off (corresponding to the clock CK2 transitioning from the first level to the second level, for example, at the time point t3), and then the switched-capacitor circuit 210 is turned off (corresponding to the clock CK1 transitioning from the first level to the second level, for example, at the time point t4).

Figure 5B:
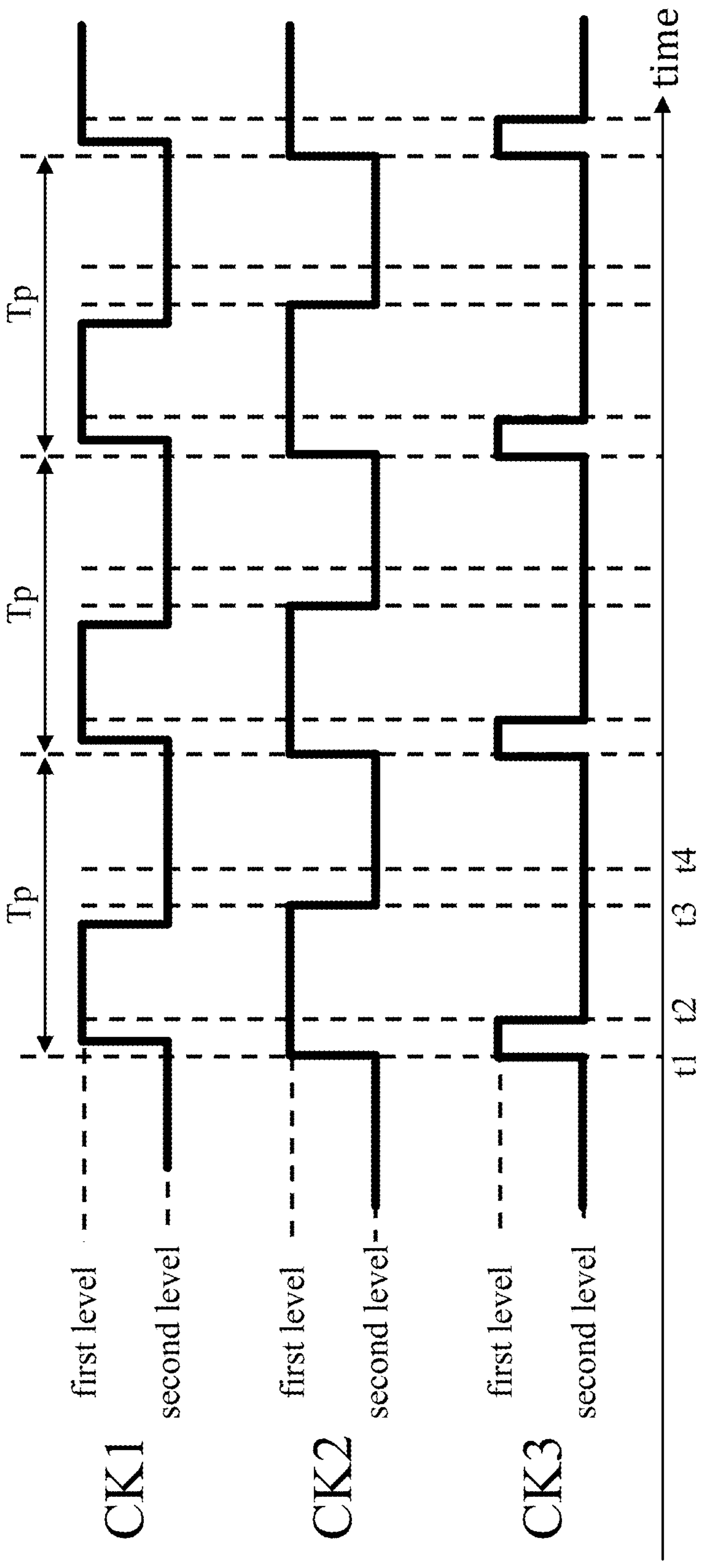
FIG. 5B shows waveforms of the operating clocks of the switching circuit according to another embodiment of the present invention.

Reference is made to FIG. 5B, which shows waveforms of the operating clocks of the switching circuit 200 according to an embodiment of the present invention. FIG. 5B corresponds to the switching circuit 200 applied to a T-switch (i.e., as a part of the T-switch).

During an operating cycle Tp of the switching circuit 200, the switched-capacitor circuit 220 is first turned on (corresponding to the clock CK2 transitioning from the second level to the first level, for example, at the time point t1), and then the switched-capacitor circuit 210 is turned on (corresponding to the clock CK1 transitioning from the second level to the first level, for example, between the time point t1 and the time point t2). The switch 230 conducts for a period of time after the switched-capacitor circuit 220 is turned on (e.g., between the time point t1 and the time point t2); that is to say, the clock CK3 is at the first level during the period of time after the clock CK2 transitions from the second level to the first level.

During an operating cycle Tp of the switching circuit 200, the switched-capacitor circuit 210 is first turned off (corresponding to the clock CK1 transitioning from the first level to the second level, for example, before the time point t3), and the switched-capacitor circuit 220 is then turned off (corresponding to the clock CK2 transitioning from the first level to the second level, for example, at the time point t3).

Figure 6:
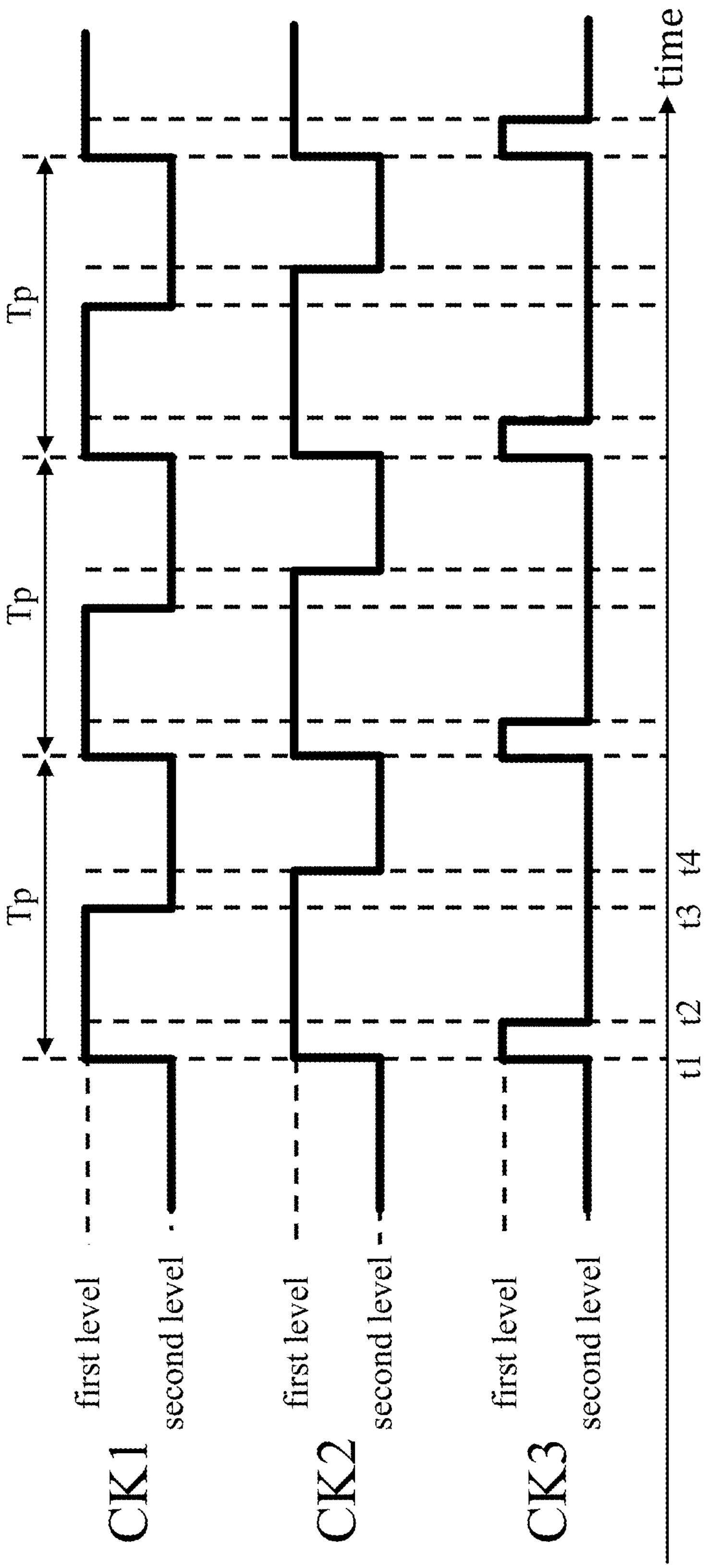
FIG. 6 shows waveforms of the operating clocks of the switching circuit according to another embodiment of the present invention.

Reference is made to FIG. 6, which shows waveforms of the operating clocks of the switching circuit 200 according to another embodiment of the present invention. FIG. 6 corresponds to the switching circuit 200 applied to a 2-rank time-interleaved analog-to-digital converter (TIADC) (i.e., as a sampling switch of the 2-rank TIADC). The clock CK1 and the clock CK2 are both periodic clocks. The clock CK3 may be a periodic pulsed signal.

During an operating cycle Tp of the switching circuit 200, the switched-capacitor circuit 210 and the switched-capacitor circuit 220 change from non-conducting to conducting at substantially the same time (e.g., at the time point t1), and the switch 230 conducts within a period of time after the switched-capacitor circuit 220 is turned on (e.g., between the time point t1 and the time point t2). In an alternative embodiment, the time point at which the clock CK2 transitions from the second level to the first level can be slightly earlier or slightly later than the time point at which the clock CK1 transitions from the second level to the first level.

During an operating cycle Tp of the switching circuit 200, the switched-capacitor circuit 210 is first turned off (e.g., at the time point t3), and then the switched-capacitor circuit 220 is turned off (e.g., at the time point t4).

In some embodiments, the switch 230 may be embodied by a transistor. Compared to the switched-capacitor circuit 210, the switch 230 is fully turned on at a faster speed (i.e., the time required to transition from being turned off to having the input voltage and the output voltage be substantially the same is shorter).

In the embodiments of FIG. 5A, FIG. 5B, and FIG. 6, the clock CK3 transitions from the second level to the first level at the time point t1, and transitions from the first level to the second level at the time point t2. In an alternative embodiment, the time point at which the clock CK3 transitions from the second level to the first level may be slightly earlier than the time point t1, and the time point at which the clock CK3 transitions from the first level to the second level may be slightly earlier or slightly later than the time point t2.

Figure 7A:
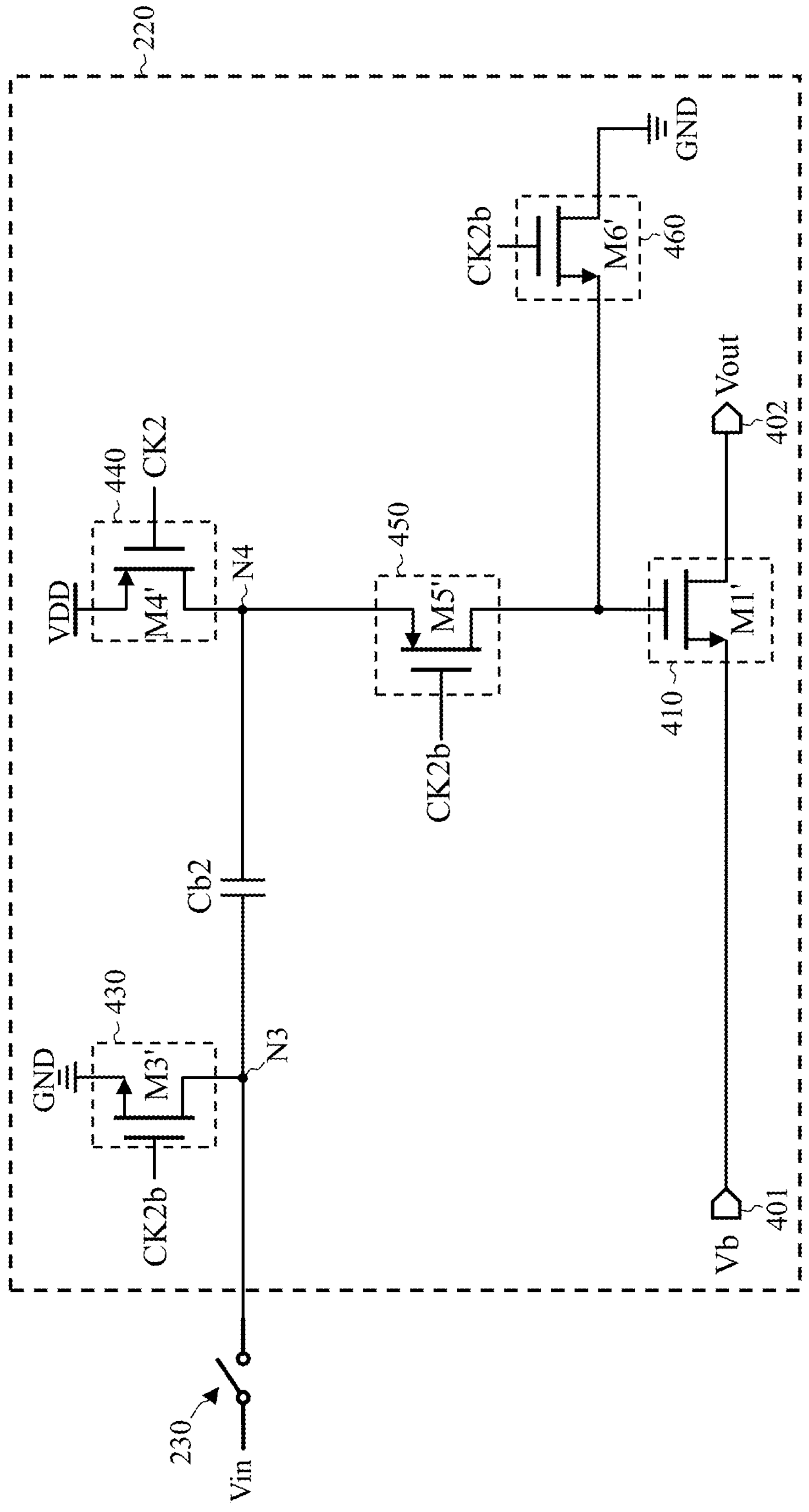
FIG. 7A is a circuit diagram of the switched-capacitor circuit 220 according to another embodiment of the present invention.

Reference is made to FIG. 7A, which is a circuit diagram of the switched-capacitor circuit 220 according to another embodiment of the present invention. FIG. 7A is similar to FIG. 4A, except that, in the embodiment of FIG. 7A, the switched-capacitor circuit 220 does not include the switch 420.

Figure 7B:
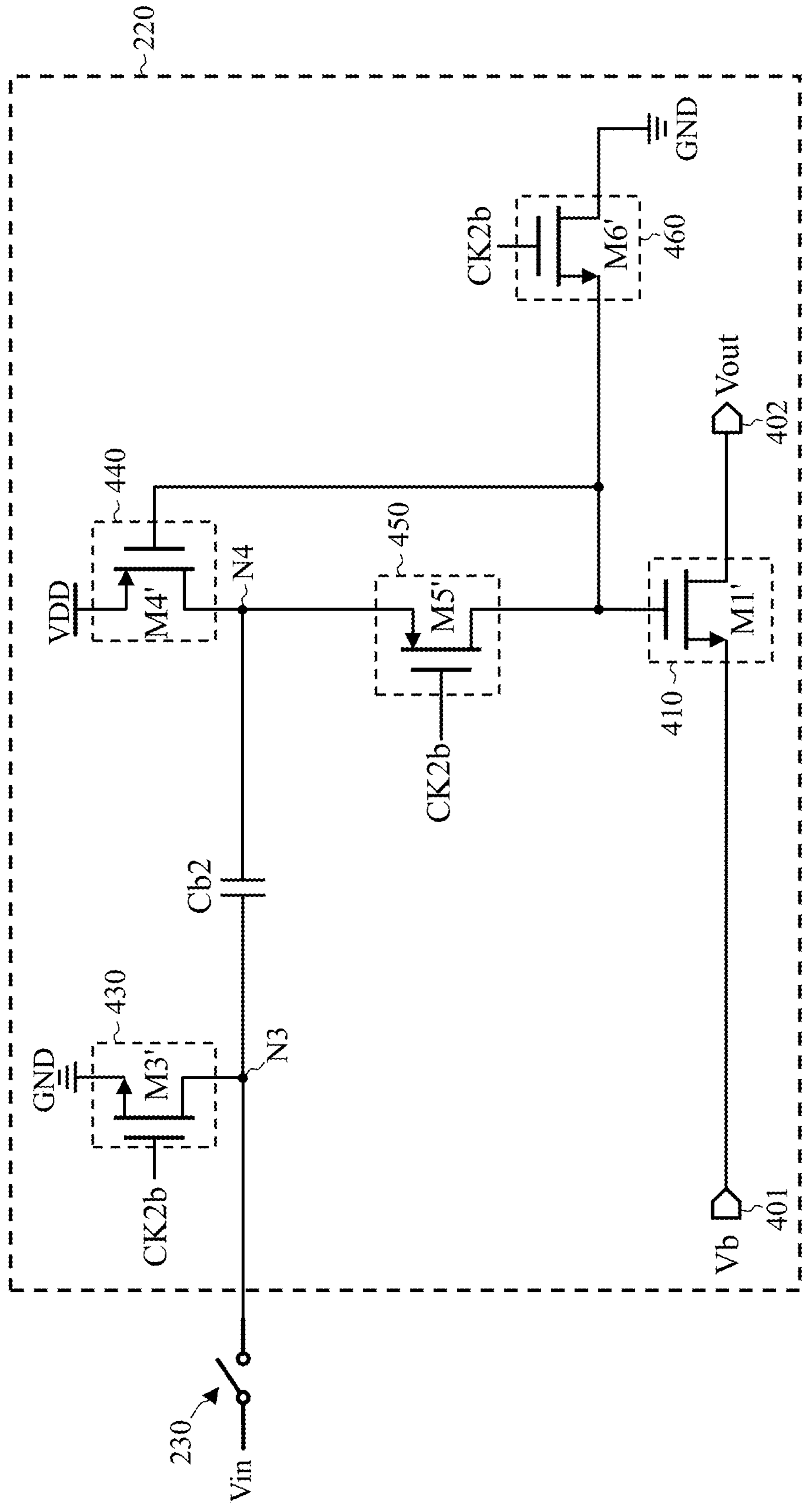
FIG. 7B is a circuit diagram of the switched-capacitor circuit 220 according to another embodiment of the present invention.

Reference is made to FIG. 7B, which is a circuit diagram of the switched-capacitor circuit 220 according to another embodiment of the present invention. FIG. 7B is similar to FIG. 4B, except that, in the embodiment of FIG. 7B, the switched-capacitor circuit 220 does not include the switch 420.

Figure 8:
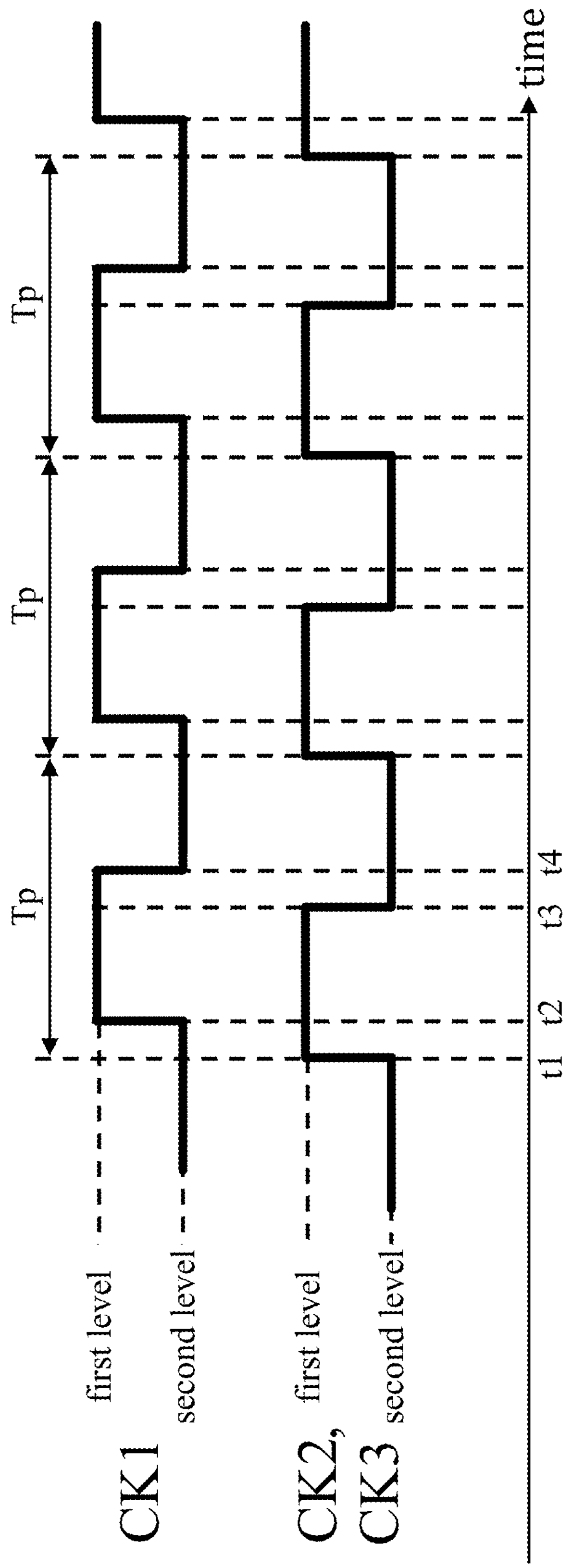
FIG. 8 shows waveforms of the operating clocks of the switching circuit according to another embodiment of the present invention.

Reference is made to FIG. 8, which shows waveforms of the operating clocks of the switching circuit 200 according to another embodiment of the present invention. The clocks of FIG. 8 are applicable to the circuit of FIG. 7A or FIG. 7B. FIG. 8 corresponds to the switching circuit 200 applied to a T-switch. FIG. 8 is similar to FIG. 5A, except that, in FIG. 8, the clock CK2 and the clock CK3 are the same clock.

Figure 9:
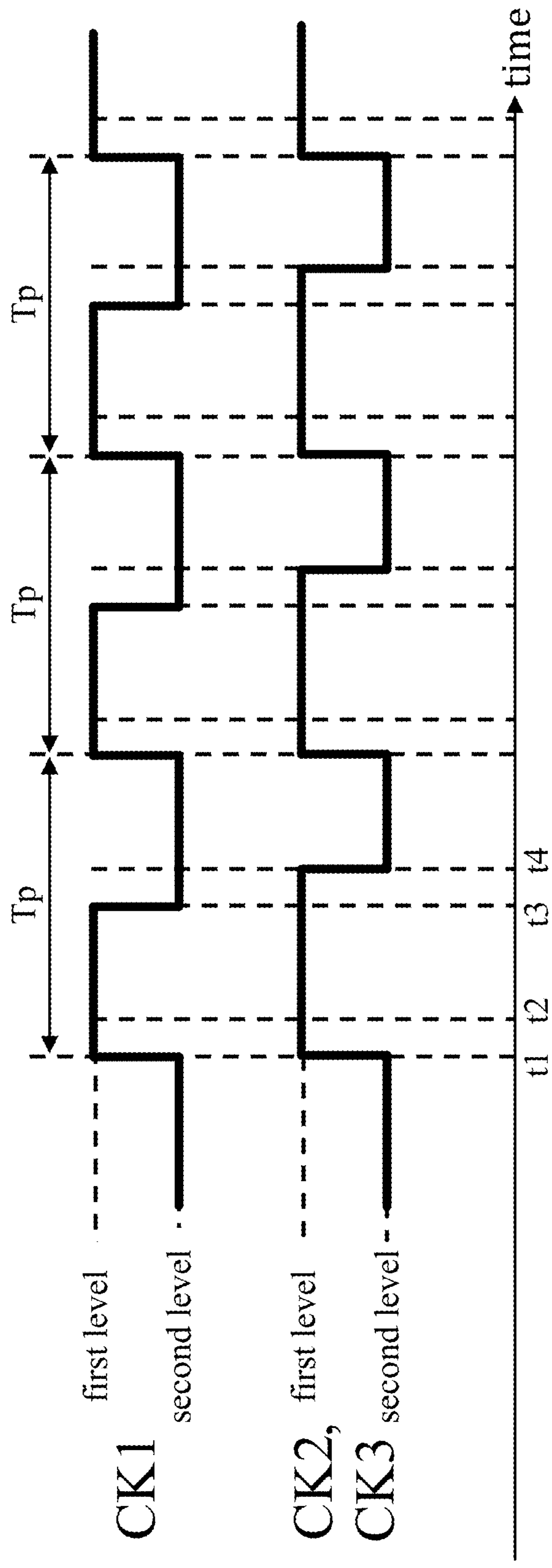
FIG. 9 shows waveforms of the operating clocks of the switching circuit according to another embodiment of the present invention.

Reference is made to FIG. 9, which shows waveforms of the operating clocks of the switching circuit 200 according to another embodiment of the present invention. The clocks of FIG. 9 are applicable to the circuit of FIG. 7A or FIG. 7B. FIG. 9 corresponds to the switching circuit 200 applied to a 2-rank TIADC. FIG. 9 is similar to FIG. 6, except that, in FIG. 9, the clock CK2 and the clock CK3 are the same clock.

According to the clocks of FIG. 5A, FIG. 5B, FIG. 6, FIG. 8, or FIG. 9, the switch 230 is turned on before the intermediate voltage Vb is substantially equal to the input voltage Vin (i.e., before the switched-capacitor circuit 210 is fully turned on), so that the voltage at the node N3 is switched to the input voltage Vin in advance (in other words, the switch 230 allows the capacitor Cb2 of the switched-capacitor circuit 220 to receive the input voltage Vin earlier), thereby increasing the overall turn-on speed of the switching circuit 200.

In summary, because the switching circuit of the present invention feeds forward the input voltage Vin to the second switched-capacitor circuit (i.e., the aforementioned switched-capacitor circuit 220) in advance, the signal delay can be reduced, and the overall turn-on speed of the switching circuit can be improved.

Figure 10:
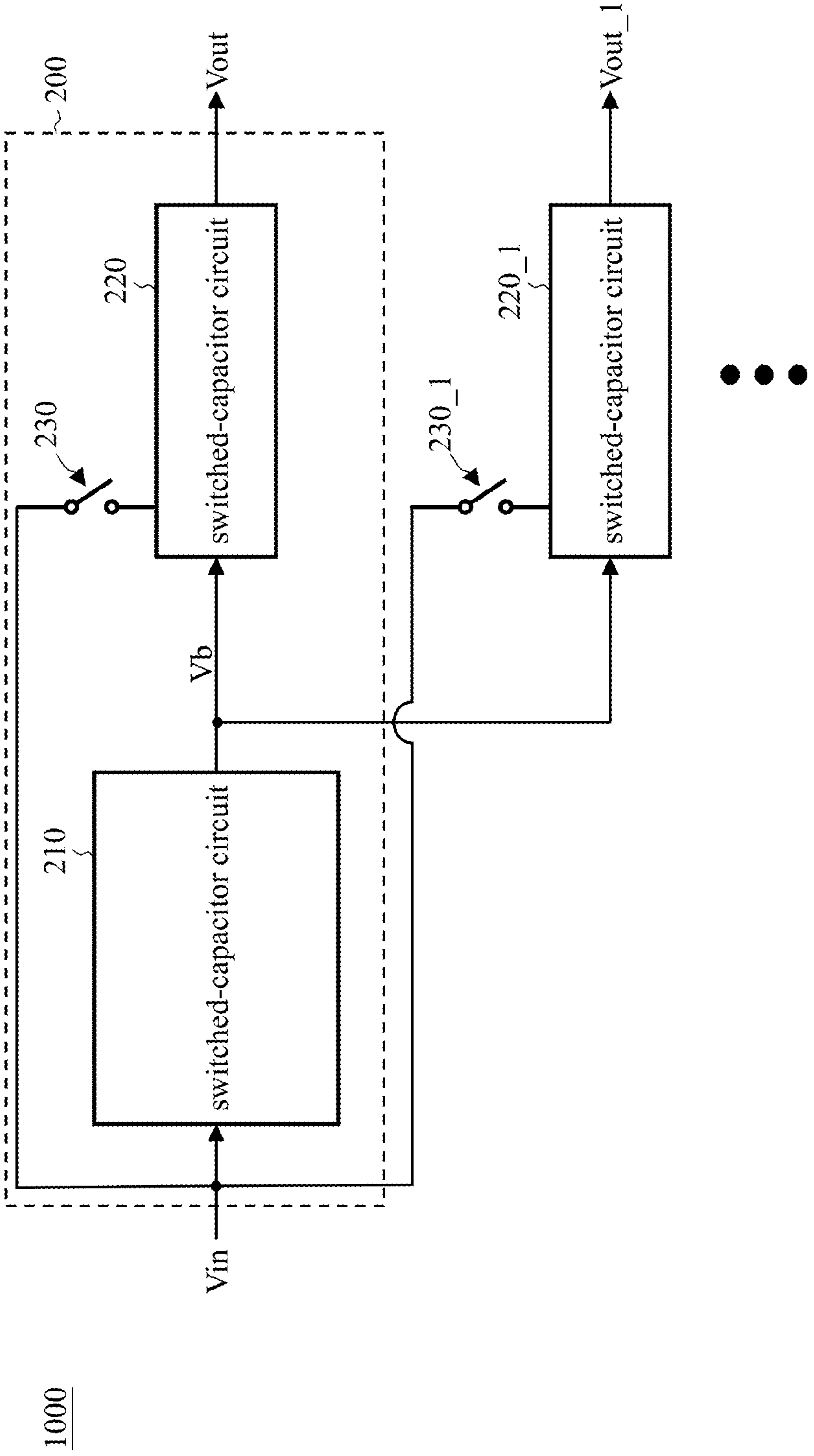
FIG. 10 is a functional block diagram of a switching circuit used for a 2-rank time-interleaved analog-to-digital converter according to an embodiment of the present invention.

Reference is made to FIG. 10, which is a functional block diagram of a switching circuit used for a 2-rank TIADC according to an embodiment of the present invention. The switching circuit 1000 serves as a sampling switch and includes the switching circuit 200, the switched-capacitor circuit 220_1, and the switch 230_1. One terminal of the switch 230_1 receives the input voltage Vin, and another terminal of the switch 230_1 is coupled or electrically connected to the switched-capacitor circuit 220 1. The function of the switched-capacitor circuit 220_1 and the function of the switch 230_1 are substantially the same as the function of the switched-capacitor circuit 220 and the function of the switch 230. The switched-capacitor circuit 220_1 is substantially the same as the switched-capacitor circuit 220, and the method of connecting the switched-capacitor circuit 220_1 with the switch 230_1 can refer to FIG. 4A, FIG. 4B, FIG. 7A, or FIG. 7B. The switched-capacitor circuit 220 and the switched-capacitor circuit 220_1 respectively generate the output voltage Vout and the output voltage Vout_1 at different time points, and the output voltage Vout and the output voltage Vout_1 are respectively converted by the first sub-ADC and the second sub-ADC (not shown) to produce the output of the TIADC. The operating principle of the TIADC is well known to people having ordinary skill in the art. Therefore, people having ordinary skill in the art can understand the control timing of the switching circuit 1000 based on FIG. 6 or FIG. 9; further elaboration is omitted for brevity.

Figure 11:
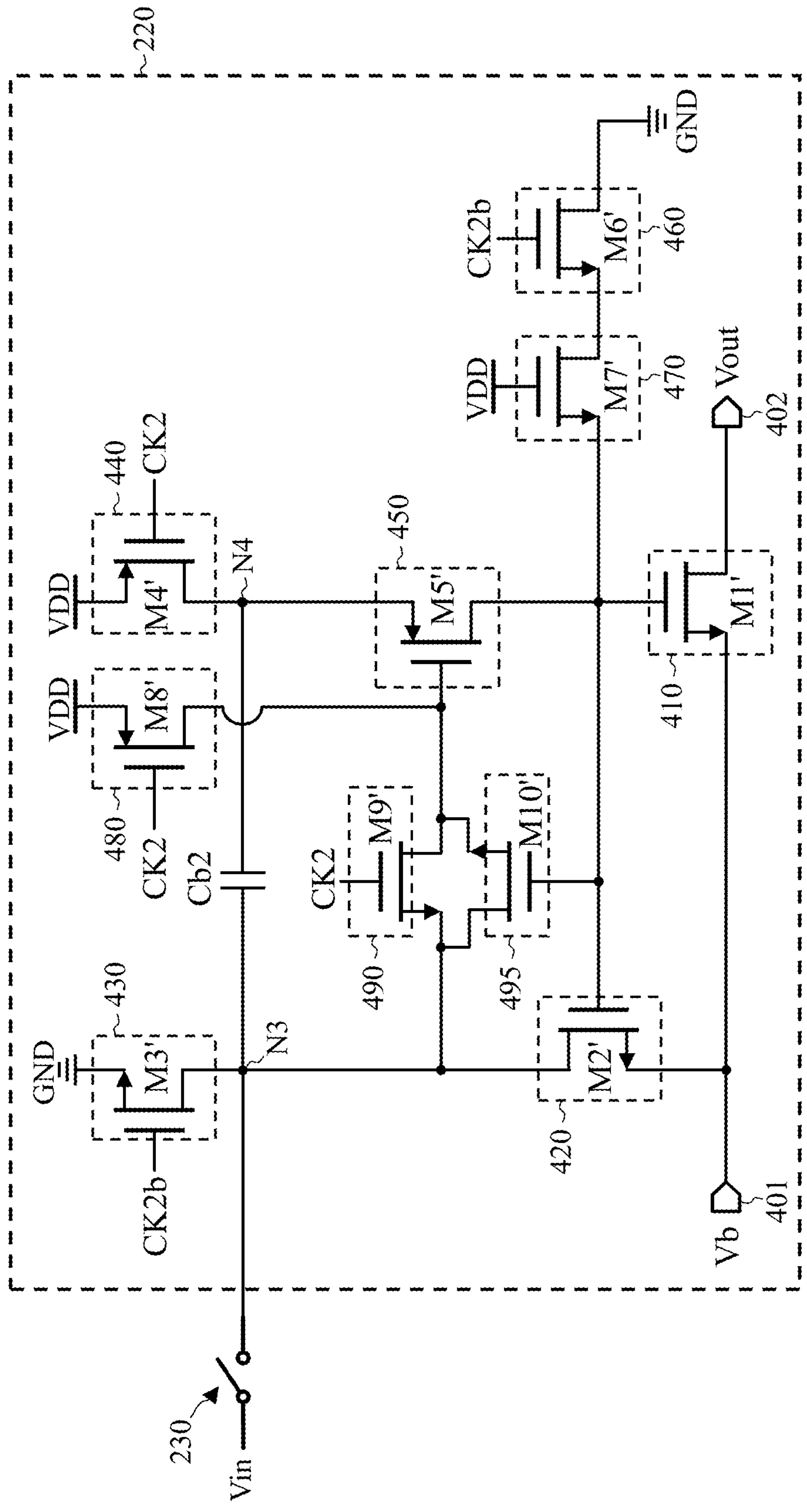
FIG. 11 is a circuit diagram of the switched-capacitor circuit 220 according to another embodiment of the present invention.

Reference is made to FIG. 11, which is a circuit diagram of the switched-capacitor circuit 220 according to another embodiment of the present invention. FIG. 11 is similar to FIG. 4A, except that in the embodiment of FIG. 11, the switched-capacitor circuit 220 further includes a switch 470, a switch 480, a switch 490, and a switch 495.

The switch 470 is embodied by an NMOS transistor M7'. One terminal (source) of the switch 470 is coupled or electrically connected to the control terminal of the switch 410; another terminal (drain) of the switch 470 is coupled or electrically connected to the source of the NMOS transistor M6'. The control terminal (gate) of the switch 470 is coupled or electrically connected to the reference voltage VDD.

The switch 480 is embodied by a PMOS transistor M8'. One terminal (source) of the switch 480 is coupled or electrically connected to the reference voltage VDD; another terminal (drain) of the switch 480 is coupled or electrically connected to the control terminal of the switch 450; the control terminal (gate) of the switch 480 receives the clock CK2.

The switch 490 is embodied by an NMOS transistor M9'. One terminal (source) of the switch 490 is coupled or electrically connected to the node N3; another terminal (drain) of the switch 490 is coupled or electrically connected to the control terminal of the switch 450; the control terminal (gate) of the switch 490 receives the clock CK2.

The switch 495 is embodied by an NMOS transistor M10'. One terminal (source) of the switch 495 is coupled or electrically connected to the control terminal of the switch 450; another terminal (drain) of the switch 495 is coupled or electrically connected to the node N3; the control terminal (gate) of the switch 495 is coupled or electrically connected to the control terminal of the switch 410.

The switch 470, the switch 480, the switch 490, and the switch 495 serve as protective components for the bootstrapped switch. The operating principle of these protective components is well known to people having ordinary skill in the art; further elaboration is omitted for brevity.

People having ordinary skill in the art can add protective components in FIG. 4B, FIG. 7A, and FIG. 7B according to FIG. 11.

In other embodiments, the PMOS transistors and the NMOS transistors in the aforementioned embodiment may be replaced by NMOS transistors and PMOS transistors, respectively. People having ordinary skill in the art know how to adjust the clock and the reference voltages accordingly to implement the above-mentioned embodiments.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A switching circuit configured to receive an input voltage and output an output voltage, comprising:

a first switched-capacitor circuit configured to receive the input voltage to generate an intermediate voltage;

a second switched-capacitor circuit coupled to the first switched-capacitor circuit and configured to receive the intermediate voltage to generate the output voltage; and a switch, wherein one terminal of the switch receives the input voltage, and another terminal of the switch is coupled to the second switched-capacitor circuit;

wherein the second switched-capacitor circuit comprises a capacitor, and the switch is electrically connected to the capacitor:

wherein the second switched-capacitor circuit is controlled by a first clock, the second switched-capacitor circuit is turned on when the first clock is at a first level, the switch is controlled by a second clock, the switch is turned on when the second clock is at the first level, and the second clock is at the first level for a period of time after the first clock transitions from a second level to the first level.

2. The switching circuit of claim 1, wherein in one operating cycle, the first switched-capacitor circuit changes from non-conducting to conducting later than the second switched-capacitor circuit, and the first switched-capacitor circuit changes from conducting to non-conducting later than the second switched-capacitor circuit.

3. The switching circuit of claim 1, wherein in one operating cycle, the first switched-capacitor circuit changes from non-conducting to conducting later than the second switched-capacitor circuit, and the first switched-capacitor circuit changes from conducting to non-conducting earlier than the second switched-capacitor circuit.

4. The switching circuit of claim 1, wherein in one operating cycle, the first switched-capacitor circuit changes from conducting to non-conducting earlier than the second switched-capacitor circuit.

5. The switching circuit of claim 1, wherein the second switched-capacitor circuit is a bootstrapped switch, and the capacitor is a bootstrap capacitor of the second switched-capacitor circuit.

6. The switching circuit of claim 5, wherein two terminals of the bootstrap capacitor are a first node and a second node, the bootstrapped switch comprising:

a first switch having a first terminal, a second terminal, and a first control terminal, wherein the first terminal is coupled to an input terminal of the bootstrapped switch, and the second terminal is coupled to an output terminal of the bootstrapped switch;

a second switch having a third terminal, a fourth terminal, and a second control terminal, wherein the third terminal is coupled to the input terminal, the fourth terminal is coupled to the first node, and the second control terminal is coupled to the first control terminal;

a third switch having a fifth terminal, a sixth terminal, and a third control terminal, wherein the fifth terminal is coupled to a first reference voltage, the sixth terminal is coupled to the first node, and the third control terminal receives an inverted signal of the first clock;

a fourth switch having a seventh terminal, an eighth terminal, and a fourth control terminal, wherein the seventh terminal is coupled to a second reference voltage, the eighth terminal is coupled to the second node, and the fourth control terminal receives the first clock;

a fifth switch having a ninth terminal, a tenth terminal, and a fifth control terminal, wherein the ninth terminal is coupled to the second node, the tenth terminal is coupled to the first control terminal, and the fifth control terminal receives the inverted signal; and a sixth switch having an eleventh terminal, a twelfth terminal, and a sixth control terminal, wherein the eleventh terminal is coupled to the first control terminal, the twelfth terminal is coupled to the first reference voltage, and the sixth control terminal receives the inverted signal.

7. The switching circuit of claim 5, wherein two terminals of the bootstrap capacitor are a first node and a second node, the bootstrapped switch comprising:

a first switch having a first terminal, a second terminal, and a first control terminal, wherein the first terminal is coupled to an input terminal of the bootstrapped switch, and the second terminal is coupled to an output terminal of the bootstrapped switch;

a second switch having a third terminal, a fourth terminal, and a second control terminal, wherein the third terminal is coupled to the input terminal, the fourth terminal is coupled to the first node, and the second control terminal is coupled to the first control terminal;

a third switch having a fifth terminal, a sixth terminal, and a third control terminal, wherein the fifth terminal is coupled to a first reference voltage, the sixth terminal is coupled to the first node, and the third control terminal receives an inverted signal of the first clock;

a fourth switch having a seventh terminal, an eighth terminal, and a fourth control terminal, wherein the seventh terminal is coupled to a second reference voltage, the eighth terminal is coupled to the second node, and the fourth control terminal is coupled to the first control terminal;

a fifth switch having a ninth terminal, a tenth terminal, and a fifth control terminal, wherein the ninth terminal is coupled to the second node, the tenth terminal is coupled to the first control terminal, and the fifth control terminal receives the inverted signal; and a sixth switch having an eleventh terminal, a twelfth terminal, and a sixth control terminal. wherein the eleventh terminal is coupled to the first control terminal, the twelfth terminal is coupled to the first reference voltage, and the sixth control terminal receives the inverted signal.

8. The switching circuit of claim 1, wherein the output voltage is a first output voltage, and the switch is a first switch, the switching circuit further comprising:

a third switched-capacitor circuit coupled to the first switched-capacitor circuit and configured to receive the intermediate voltage to generate a second output voltage; and a second switch, wherein one terminal of the second switch receives the input voltage, and another terminal of the second switch is coupled to the third switched-capacitor circuit.

9. The switching circuit of claim 1, wherein when the first switched-capacitor circuit is turned on, the intermediate voltage is substantially equal to the input voltage, and the switch is turned on before the intermediate voltage is substantially equal to the input voltage.

10. A switching circuit configured to receive an input voltage and output an output voltage, comprising:

a first switched-capacitor circuit configured to receive the input voltage to generate an intermediate voltage;

a second switched-capacitor circuit coupled to the first switched-capacitor circuit and configured to receive the intermediate voltage to generate the output voltage; and a switch, wherein one terminal of the switch receives the input voltage, and another terminal of the switch is coupled to the second switched-capacitor circuit;

wherein the second switched-capacitor circuit comprises a capacitor, and the switch is electrically connected to the capacitor;

wherein the second switched-capacitor circuit and the switch are controlled by a clock, the second switched-capacitor circuit and the switch are turned on when the clock is at a first level, and the second switched-capacitor circuit and the switch are turned off when the clock is at a second level;

wherein when the second switched-capacitor circuit is turned on, the output voltage is substantially equal to the intermediate voltage.

11. The switching circuit of claim 10, wherein in one operating cycle, the first switched-capacitor circuit changes from non-conducting to conducting later than the second switched-capacitor circuit, and the first switched-capacitor circuit changes from conducting to non-conducting later than the second switched-capacitor circuit.

12. The switching circuit of claim 10, wherein in one operating cycle, the first switched-capacitor circuit changes from conducting to non-conducting earlier than the second switched-capacitor circuit.

13. The switching circuit of claim 10, wherein two terminals of the capacitor are a first node and a second node respectively, the second switched-capacitor circuit comprising:

a first switch having a first terminal, a second terminal, and a first control terminal, wherein the first terminal is coupled to an input terminal of the second switched-capacitor circuit, and the second terminal is coupled to an output terminal of the second switched-capacitor circuit;

a second switch having a third terminal, a fourth terminal, and a second control terminal, wherein the third terminal is coupled to a first reference voltage, the fourth terminal is coupled to the first node, and the second control terminal receives an inverted signal of the clock;

a third switch having a fifth terminal, a sixth terminal, and a third control terminal, wherein the fifth terminal is coupled to a second reference voltage, the sixth terminal is coupled to the second node, and the third control terminal receives the clock;

a fourth switch having a seventh terminal, an eighth terminal, and a fourth control terminal, wherein the seventh terminal is coupled to the second node, the eighth terminal is coupled to the first control terminal, and the fourth control terminal receives the inverted signal; and a fifth switch having a ninth terminal, a tenth terminal, and a fifth control terminal, wherein the ninth terminal is coupled to the first control terminal, the tenth terminal is coupled to the first reference voltage, and the fifth control terminal receives the inverted signal.

14. The switching circuit of claim 10, wherein two terminals of the capacitor are a first node and a second node respectively, the second switched-capacitor circuit comprising:

a first switch having a first terminal, a second terminal, and a first control terminal, wherein the first terminal is coupled to an input terminal of the second switched-capacitor circuit, and the second terminal is coupled to an output terminal of the second switched-capacitor circuit;

a second switch having a third terminal, a fourth terminal, and a second control terminal, wherein the third terminal is coupled to a first reference voltage, the fourth terminal is coupled to the first node, and the second control terminal receives an inverted signal of the clock;

a third switch having a fifth terminal, a sixth terminal, and a third control terminal, wherein the fifth terminal is coupled to a second reference voltage, the sixth terminal is coupled to the second node, and the third control terminal is coupled to the first control terminal;

a fourth switch having a seventh terminal, an eighth terminal, and a fourth control terminal, wherein the seventh terminal is coupled to the second node, the eighth terminal is coupled to the first control terminal, and the fourth control terminal receives the inverted signal; and a fifth switch having a ninth terminal, a tenth terminal, and a fifth control terminal, wherein the ninth terminal is coupled to the first control terminal, the tenth terminal is coupled to the first reference voltage, and the fifth control terminal receives the inverted signal.

15. A switching circuit configured to receive an input voltage and output an output voltage, comprising:

a first switched-capacitor circuit configured to receive the input voltage to generate an intermediate voltage;

a second switched-capacitor circuit coupled to the first switched-capacitor circuit and configured to receive the intermediate voltage to generate the output voltage; and a switch, wherein one terminal of the switch receives the input voltage, and another terminal of the switch is coupled to the second switched-capacitor circuit;

wherein the second switched-capacitor circuit comprises a capacitor, and the switch is electrically connected to the capacitor;

wherein the output voltage is a first output voltage, and the switch is a first switch, the switching circuit further comprising:

a third switched-capacitor circuit coupled to the first switched-capacitor circuit and configured to receive the intermediate voltage to generate a second output voltage; and a second switch, wherein one terminal of the second switch receives the input voltage, and another terminal of the second switch is coupled to the third switched-capacitor circuit.

* * * * *